US005252833A

United States Patent [19]

Kane et al.

[11] Patent Number: 5,252,833

[45] Date of Patent: Oct. 12, 1993

[54] ELECTRON SOURCE FOR DEPLETION MODE ELECTRON EMISSION APPARATUS

[75] Inventors: Robert C. Kane; James E. Jaskie, both of Scottsdale, Ariz.

[73] Assignee: Motorola, Inc., Schaumburg, Ill.

[21] Appl. No.: 831,703

[22] Filed: Feb. 5, 1992

[51] Int. Cl.[5] .......... H01J 37/073

[52] U.S. Cl. .......... 250/423 F; 250/423 R

[58] Field of Search .......... 250/423 R, 423 F; 313/336

[56] References Cited

U.S. PATENT DOCUMENTS

| | | | |
|---|---|---|---|
| 3,646,841 | 3/1972 | Villalobos | 83/170 |
| 3,751,780 | 8/1973 | Villalobos | 83/651 |
| 3,998,678 | 12/1976 | Fukase et al. | 313/336 |
| 4,143,292 | 3/1979 | Hosoki et al. | 313/336 |
| 4,164,680 | 8/1979 | Villalobos | 250/423 R |
| 5,012,153 | 4/1991 | Atkinson et al. | 313/336 |
| 5,126,574 | 6/1992 | Gallagher | 250/423 F |
| 5,129,850 | 7/1992 | Kane et al. | 445/24 |
| 5,191,217 | 3/1993 | Kane et al. | 250/423 F |

*Primary Examiner*—Bruce C. Anderson

*Attorney, Agent, or Firm*—Eugene A. Parsons

[57] ABSTRACT

A depletion mode electron emission apparatus with an electron source including a plurality of preferentially oriented diamond crystallites. Applications employing pluralities of electron sources including preferentially oriented diamond crystallites include image display devices.

13 Claims, 4 Drawing Sheets

ELECTRON SOURCE FOR DEPLETION MODE ELECTRON EMISSION APPARATUS

FIELD OF THE INVENTION

The present invention relates generally to electron devices employing free space transport of electrons and more particularly to electron devices employing polycrystalline diamond electron sources.

BACKGROUND OF THE INVENTION

Electron devices employing free space transport of electrons are known in the art. Generally, such devices employ an electron source which emits electrons which have acquired sufficient energy to overcome a surface barrier potential. In one commonly employed prior art method of providing emitted electrons, thermal energy is added to elevate electrons, disposed in the electron source, to a higher energy state which exceeds the potential barrier. In another commonly employed method of the prior art, structures comprised of geometric discontinuities of very small radius of curvature, on the order of 500 Angstroms, are employed.

In the instance of the devices employing electron sources wherein the additional energy is introduced as thermal energy, overall device efficiency is reduced as is the opportunity for integration of the structure. In the instance of devices employing electron sources exhibiting features with geometric discontinuities of small radius of curvature the need to employ complex fabrication processes poses some limitation on the practicality and utility of the electron source.

Accordingly there exists a need for an electron device employing an electron source which overcomes at least some of the shortcomings of the prior art.

SUMMARY OF THE INVENTION

This need and others are substantially met through provision of an electron source including a supporting substrate having a major surface and a plurality of diamond crystallites, each having a surface, and at least some of which diamond crystallites are preferentially crystallographically oriented, the diamond crystallites being disposed on the major surface of the supporting substrate such that an electric field induced at a surface of at least some of the plurality of diamond crystallites induces electron emission from at least some of the diamond crystallites.

This need and others are further met through provision of electron emission apparatus including an electron source, for emitting electrons, having a supporting substrate on which is disposed a plurality of preferentially crystallographically oriented diamond crystallites and an anode, distally disposed with respect to the electron source, for collecting at least some of any emitted electrons, the anode and the electron source being constructed to have a voltage source coupled therebetween such that an electric field induced at the electron source provides for electron emission from the electron source toward the anode.

DETAILED DESCRIPTION OF THE PREFERRED EMBODIMENTS

Figure 1:
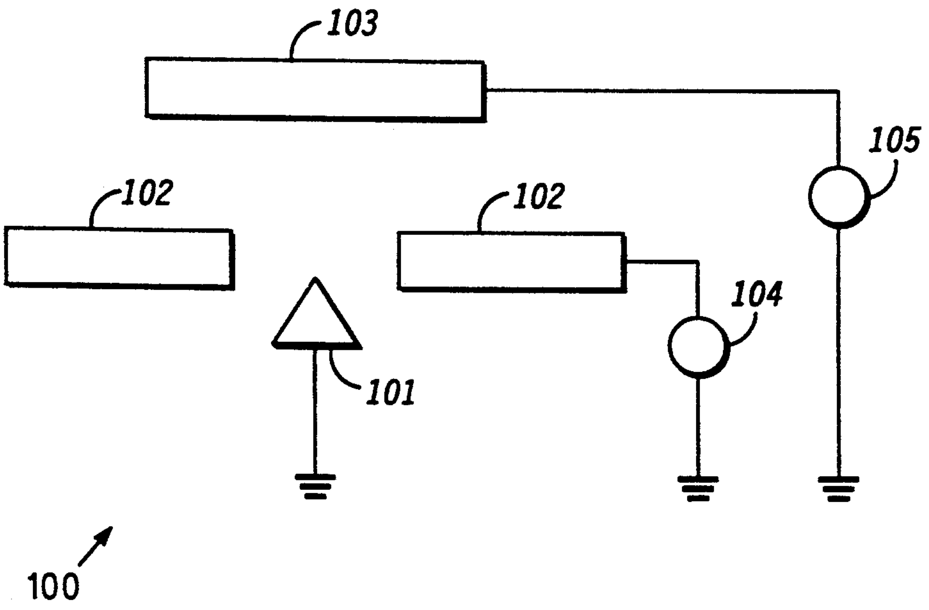
FIG. 1 is a schematical depiction of a prior art electron device employing an electron source.

Referring now to FIG. 1 there is depicted a schematical representation of a prior art electron device 100 employing an electron source 101, an extraction electrode 102, and an anode 103. Source 101 has a feature with a geometric discontinuity of small radius of curvature herein depicted as an apex to the conically shaped (schematically corresponding to a side elevational cross sectional view of a physical structure) electron source 101.

Prior art electron devices, realized as schematically depicted, typically employ a supporting substrate on which the electron source is disposed and an insulating layer, disposed on the supporting substrate. The material which comprises the extraction electrode is disposed on the insulating layer. The anode of a physical structure is typically distally disposed with respect to the electron source in a manner which provides that at least some of any emitted electrons are collected by the anode.

Referring once again to FIG. 1 there is depicted an externally provided voltage source 104 operably coupled to extraction electrode 102. When voltage source 104 provides a voltage of proper magnitude and polarity to extraction electrode 102 an enhanced electric field is induced at the region of geometric discontinuity of small radius of curvature of electron source 101. A second externally provided voltage source 105 is coupled to anode 103 such that when second voltage source 105 provides a voltage of proper polarity and magnitude at least some of any emitted electrons are collected at anode 103.

Electron devices of the prior art embodied as described above and with reference to the schematical representation of FIG. 1 function in accordance with the Fowler - Nordheim relation, $$J=A_1E_2exp\{-6.87\times10^7\phi^{3/2}\,v/E\}$$

where $\phi$is the material work function

J is the emitted electron current density

E is the enhanced electric field in the region at the emission surface k is Boltzmann's constant in eV $v=0.95-y^2$ and $$y=3.79\times10^{-4}E^{\frac{1}{2}}/\phi$$

$$A_1=(3.844\times10^{-11}E_F/[(\phi+E_F)^2\phi])^{\frac{1}{2}}$$

where $E_F$ is the Fermi energy level

Generally the Fowler-Nordheim relation is not expressed in the form wherein the dependence on the Fermi energy level is explicit since most applications involve good metallic conductors which may approximate a Fermi given above is chosen since, in accordance with the present invention, we will consider the emission properties of n-doped polycrystalline diamond semiconductor.

In order to obtain desirable electron emission from materials suited for use as electron emitters such as, for example, refractory metals, it is necessary to provide extremely high electric fields (on the order of $3\times10^7$V/cm) at the surface of the electron emitting structure.

Figure 2:
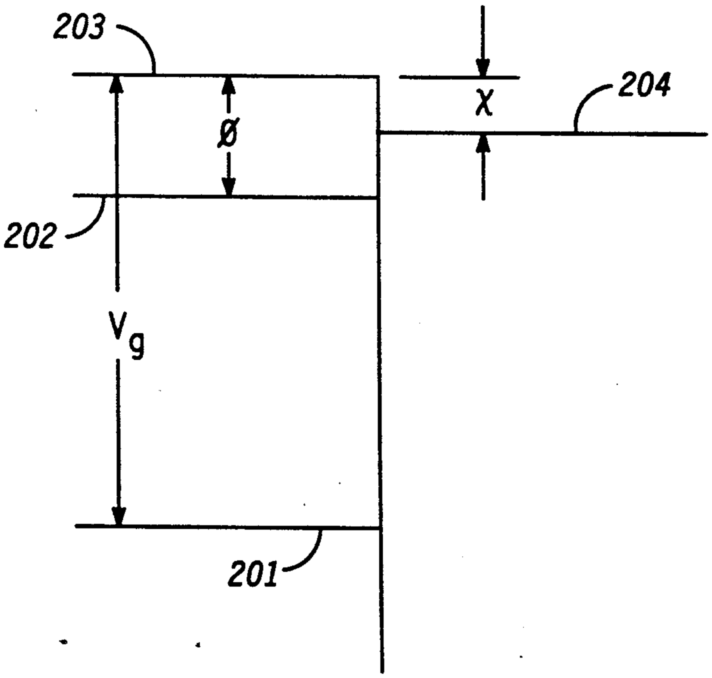
FIG. 2 is a schematic representation of an energy diagram of diamond.

FIG. 2 depicts, schematically, an energy diagram which represents the various energy levels for n-doped semiconductor diamond. In the instance of the present disclosure our interest primarily focuses on those groups of diamond which are semiconducting, such as type IIB diamond. A valence band energy level 201, a conduction band energy level 203, a vacuum potential 204, and a Fermi energy level, $E_F$, 202 are shown. In FIG. 2, Vg corresponds to the bandgap voltage which is described as the difference in energy between an electron residing in an energy state corresponding to a highest energy state in the valence band (valence band energy level 201) and an electron residing in an energy state corresponding to a lowest energy state in the conduction band (conduction band energy level 203). For the energy diagram of FIG. 2, a surface work function, $\phi$, indicates the voltage difference between the Fermi energy level 202 and the conduction band energy level 203.

Typically, materials employed as electron sources must also contend with an additional impediment to electron emission. An affinity of materials to retain electrons generally serves to increase the surface work function and correspondingly increase the energy which must be provided to each electron in order that it may escape the binding forces at the surface of the material.

However, in the instance of some crystallographic orientations of diamond, such as the (111) crystallographic plane, the electron affinity is less than zero. That is, conduction band electrons arriving at the surface of (111) diamond will not be restricted from departing the surface by a binding force within the electron source material. FIG. 2 depicts this negative electron affinity, $\chi$, as the conduction band energy level 203, corresponding to the lowest energy states of the conduction band, at an energy level higher than the energy level of the vacuum barrier potential 204. In the instance of a semiconductor system for which FIG. 2 is representative, electrons excited to the conduction band will possess sufficient energy to be liberated from the electron source surface.

For n-doped semiconductive diamond we have, $$E_F=4.8\text{eV}$$

($E_F$=2.75eV for intrinsic diamond)

$$\phi=0.7\text{eV}$$

The work function for diamond semiconductor, type IIB, corresponds to the (111) crystallographic plane which exhibits a negative electron affinity. As such it is sufficient to elevate electrons to the lowest energy states within the conduction band to effect emission from the surface.

From the preceding it is found that to achieve the same level of electron current density from a surface corresponding to the (111) crystallographic orientation of n-doped semiconductor diamond an electric field strength on the order of 1.4MV/cm is required.

It is one object of the present invention to provide apparatus wherein electron emission is realized from an electron source comprised of n-doped polycrystalline diamond material and operated in conjunction with an attendant electric field induced at at least part of a surface of the material.

Figure 3:
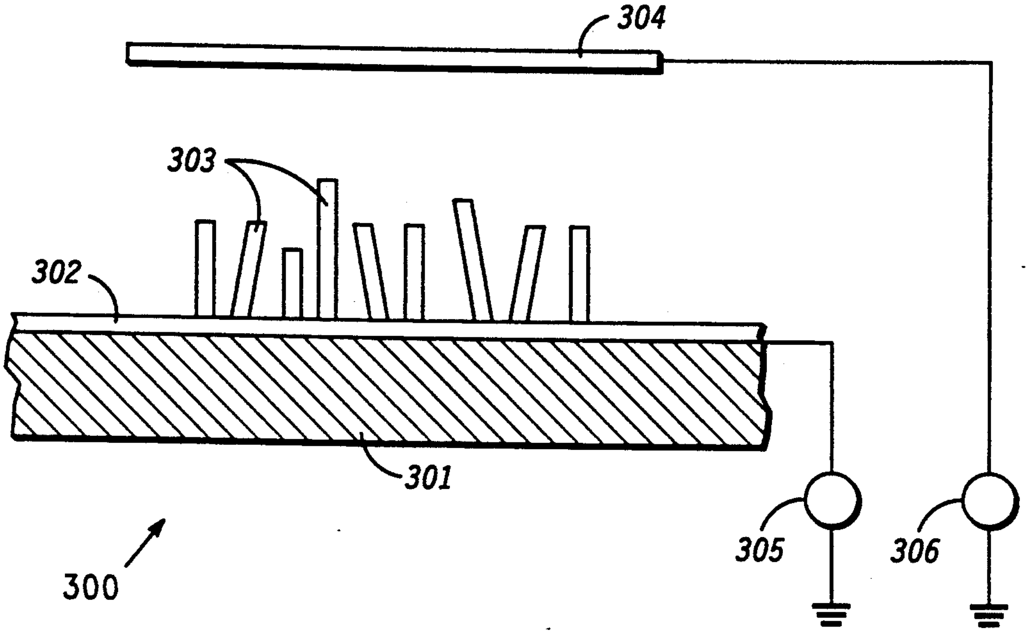
FIG. 3 is a side elevational cross-sectional depiction of an apparatus employing an electron source in accordance with the present invention.

It is another object of the present invention to provide apparatus including an electron source realized as a plurality of diamond material crystallites at least some of which are preferentially oriented such that an externally provided voltage source, operably coupled to the apparatus, causes an electron emission inducing electric field to be realized at the surface corresponding to the (111) crystallographic plane. FIG. 3 is a side elevational cross-sectional depiction of an embodiment of electron emission apparatus 300 in accordance with the present invention including a supporting substrate 301 having a major surface, at least one conductive/semiconductive path 302 disposed on the major surface of the supporting substrate, a plurality of diamond film crystallite electron emitters 303 disposed at least partially on conductive/semiconductive path 302, an anode 4, and first and second externally provided voltage sources 305 and 306. The plurality of diamond crystallite electron emitters 303 are realized by; first, depositing/forming a layer of polycrystalline diamond on the major surface of the supporting substrate or, as is the instance of the structure depicted, on conductive/semiconductive path 302, and subsequently selectively etching some of the deposited polycrystalline diamond such that substantially only those diamond crystallites exhibiting a preferred crystallographic orientation remain. In one preferred embodiment those diamond crystallites, of the plurality of crystallites which comprise the polycrystalline diamond film, formed with the (111) crystallographic orientation (surface) disposed most distally from and parallel to the major surface of the supporting substrate remain substantially unetched.

The realizable emission current density is entirely adequate for many applications utilizing electron devices employing electron sources including most image display applications. A structure which provides the field enhancement necessary for this level of electron emission is realized by selectively etching a film of polycrystalline diamond and employing a peripheral control gate which operates at or below the electron source reference voltage.

Since there exist techniques to enhance the occurrence of a preferred orientation in a polycrystalline diamond structure by varying reactant proportions, temperature, and pressures it can be anticipated that a fill factor of 10% is conservative and that as much as 25% may be achievable.

Figure 4:
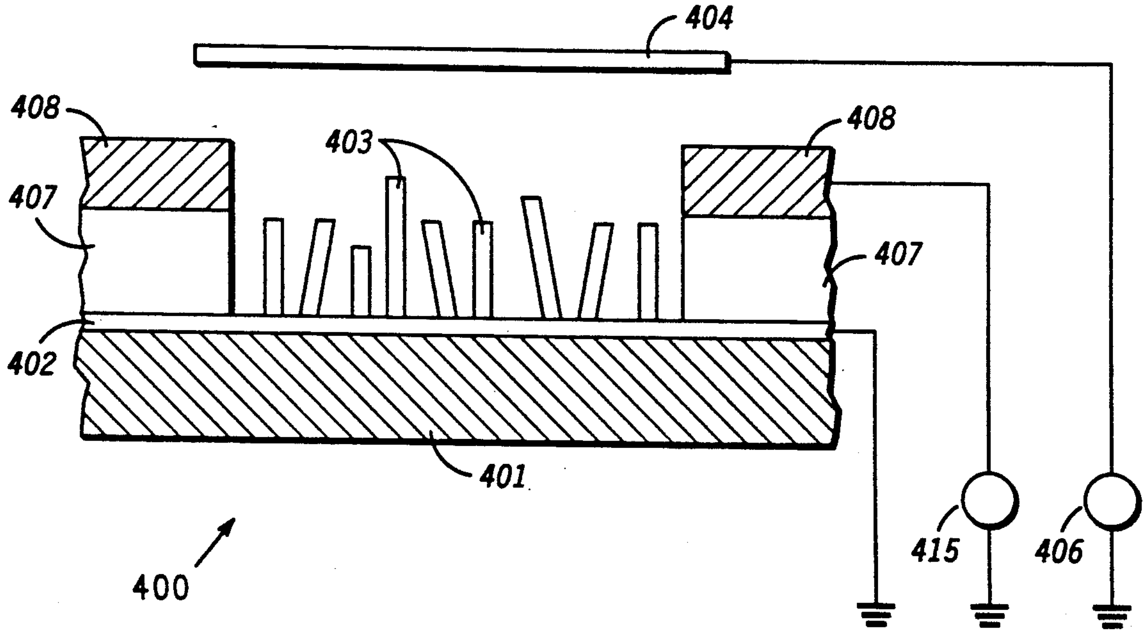
FIG. 4 is a side elevational cross-sectional depiction of another embodiment of an apparatus employing an electron source in accordance with the present invention.

While electron emission from the (111) plane has been considered because of the associated negative electron affinity, it should be noted that the {100} orientations exhibit electron emission capabilities which may be employed. Referring now to FIG. 4 there is depicted a side elevational cross-sectional view of another embodiment of an electron emission apparatus 400, similar to the device described in FIG. 3, wherein reference designators corresponding to device features first described in FIG. 3 are similarly referenced beginning with the numeral "4". Apparatus 400 further includes a controlling electrode 408 disposed on an insulating layer 407, which insulating layer 407 is disposed on the major surface of a supporting substrate 401. A third externally provided voltage source 415 is operably coupled to controlling electrode 408 to function as an electron emission modulating electrode. With controlling electrode 408 disposed as shown in FIG. 4, the voltage applied to controlling electrode 408 influences both the magnitude and polarity of the electric field which is induced at the surfaces of the plurality of diamond crystallite electron emitters 403.

Figure 5:
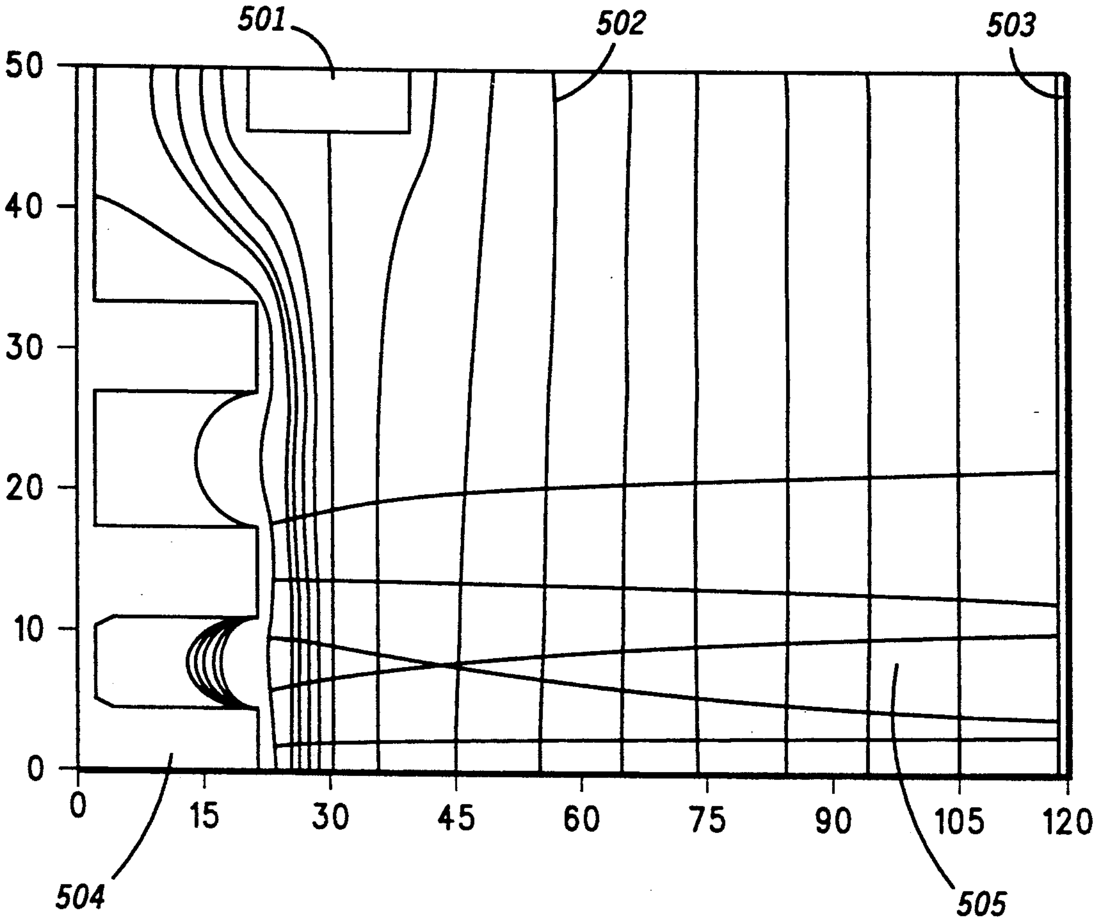
FIG. 5 is a computer model representation of an apparatus employing an electron source in accordance with the present invention.

FIG. 5 is a partial cross-section computer model representation of an embodiment of an electron emission apparatus in accordance with the present invention. The coordinate system is delineated in mesh units of 0.2μper unit with 120 units along the ordinate and 50 mesh units along the abscissa. A plurality of electron emitters 504, for emitting electrons, are shown substantially disposed planarly. A control electrode 501 is radially and axially displaced with respect to electron emitters 504. Since the computer model representation is a cylindrically symmetric cross-sectional representation, control electrode 501 may be envisioned as extending around the periphery of the plurality of electron emitters 504 in an annular manner. An anode 503, for collecting at least some of any emitted electrons, is shown distally disposed with respect to electron emitters 504.

Application of appropriate voltages as described previously with reference to FIGS. 3 and 4 causes an electric field to be induced in the interspace region between electron emitters 504 and anode 503. Additionally an enhanced electric field exists in the region near/at electron emitters 504 as depicted by the increased density equipotential lines 502. Equipotential lines 502 indicate the relative electric field enhancement effect and can be observed, in FIG. 5, to indicate an electric field enhancement in the region of electron emitters 504. Electron emission is depicted in this computer model representation as electron trajectory paths 505.

A structure realized as depicted by the computer model representation of FIG. 5 preferentially emits electrons from the region of enhanced electric field toward the anode. Employing an electron source including impurity doped diamond crystallites provides for substantial electron emission at electric field strengths at least one order of magnitude lower than electric fields required by electron sources of the prior art. A controlling electrode, such as the previously described control gate 501, is employed in a depletion mode to inhibit electron emission which is otherwise initiated by the electric field induced due to an applied anode voltage.

Figure 6:
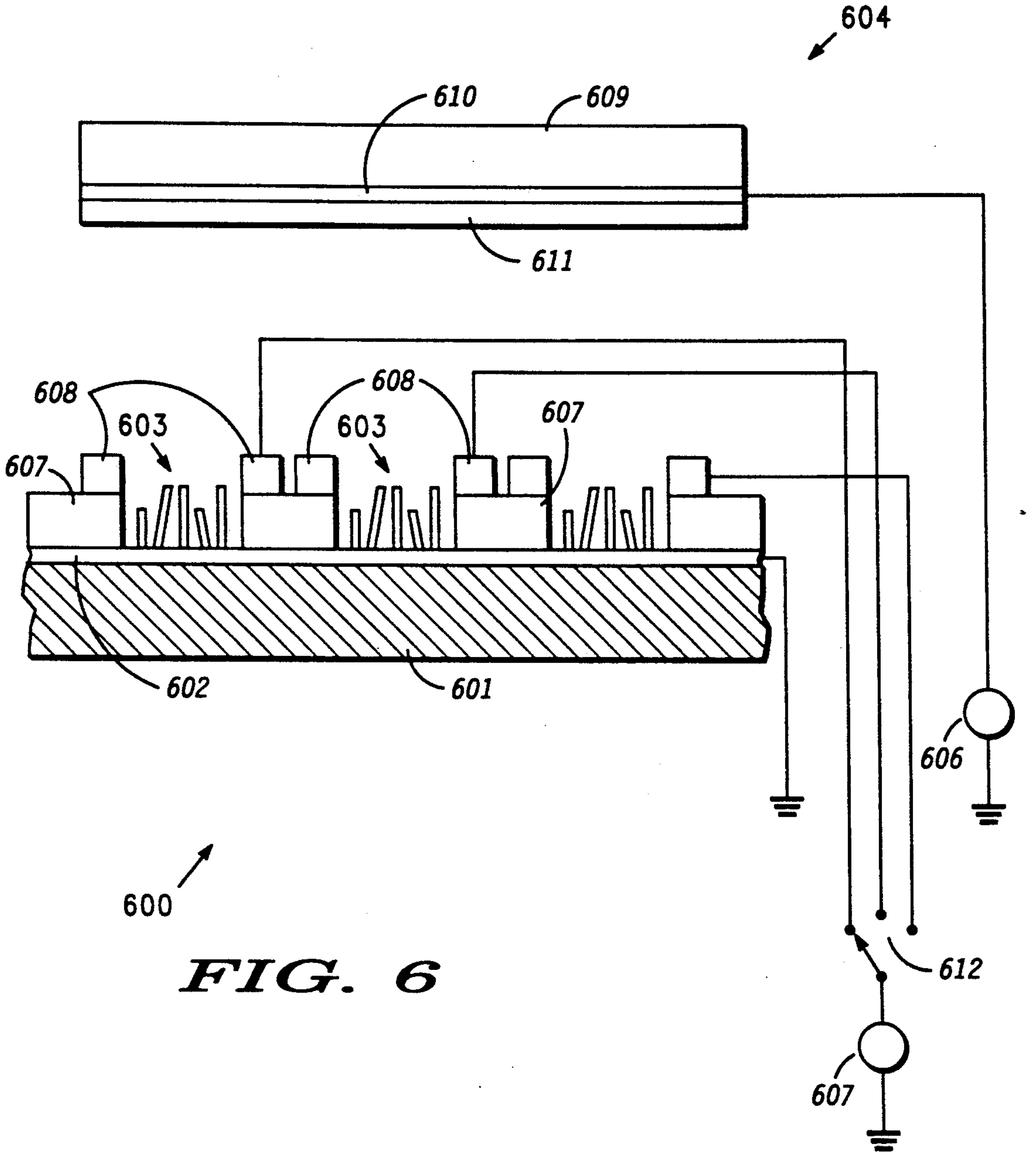
FIG. 6 is a side elevational cross-sectional depiction of yet another embodiment of an apparatus employing an electron source in accordance with the present invention.

Referring now to FIG. 6 there is shown a side elevational cross-sectional representation of a structure 600 wherein features described previously with reference to FIGS. 3 and 4 are similarly referenced beginning with the numeral "6". Structure 600 includes a plurality of electron sources 603 each of which includes a plurality of preferentially oriented diamond crystallites. Each electron source 603 has associated therewith a control gate 608 operably coupled to externally provided switching apparatus 612. An externally provided voltage source 607, operably coupled to switching apparatus 612 provides for selected control to each of the plurality of control gates 608. An anode 604 includes a substantially optically transparent faceplate 609 on which is deposited a substantially optically transparent conductive layer 610, which in turn has deposited thereon a cathodoluminescent layer 611, all distally disposed with respect to electron sources 603. Electrons, emitted from any of the plurality of electron sources 603 by means of an electric field induced due to application of a voltage to conductive layer 610, as a result of operably coupling a second externally provided voltage source 606 to said conductive layer 610, are preferentially collected at anode 604 and excite photon emission from layer 611 of cathodoluminescent material.

Apparatus realized as described above with reference to FIG. 6 may be employed as an image display apparatus. It is anticipated that a greater number of selectively controlled electron sources, even to the extent of one million or more controlled electron sources, may be employed within a single image display apparatus.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. An electron source comprising:
a supporting substrate having a major surface; and
a plurality of diamond crystallites, each having a surface, and at least some of which diamond crystallites are preferentially crystallographically oriented, the diamond crystallites being individually disposed on the major surface of the supporting substrate such that an electric field induced at a surface of at least some of the plurality of diamond crystallites induces electron emission from at least some of the diamond crystallites.

2. The electron source of claim 1 wherein the preferred orientation is the (111) crystallographic orientation.

3. The electron source of claim 2 wherein the preferred orientation corresponds to the surface of the diamond crystallites.

4. An electron source comprising:
a supporting substrate having a major surface;
a conductive/semiconductive path disposed on the major surface of the supporting substrate; and
a plurality of diamond crystallites, each having a surface, and at least some of which are preferentially crystallographically oriented, the diamond crystallites being individually disposed on the conductive/semiconductive path such that an electric field induced at a surface of at least some of the plurality of diamond crystallites induces electron emission from at least some of the diamond crystallites.

5. The electron source of claim 4 wherein the preferred orientation is the (111) crystallographic orientation.

6. The electron source of claim 4 wherein the preferred orientation corresponds to the surface of the diamond crystallites.

7. Electron emission apparatus comprising:

an electron source, for emitting electrons, including a supporting substrate on which are individully disposed a plurality of preferentially crystallographically oriented diamond crystallites;

an anode, distally disposed with respect to the electron source, for collecting at least some of the emitted electrons; and the anode and the electron source being constructed to have a voltage source coupled therebetween such that an electric field induced at the electron source provides for electron emission from the electron source toward the anode.

8. Electron emission apparatus comprising:

an electron source, for emitting electrons, including a supporting substrate having a major surface, a conductive/semiconductive path disposed on the major surface of the supporting substrate, and a plurality of preferentially crystallographically oriented diamond crystallites individually disposed on the conductive/semiconductive path;

an anode, distally disposed with respect to the electron source, for collecting at least some of the emitted electrons; and the anode and the electron source being constructed to have a voltage source coupled therebetween such that an electric field induced at the electron source provides for electron emission from the electron source toward the anode.

9. Electron emission apparatus comprising:

an electron source, for emitting electrons, including a supporting substrate having a major surface, a conductive/semiconductive path disposed on the major surface of the supporting substrate; and a plurality of preferentially crystallographically oriented diamond crystallites individually disposed on the conductive/semiconductive path;

an insulator layer disposed on the major surface of the supporting substrate;

a control gate disposed on the insulator layer and further disposed substantially peripherally at least partially around the electron source, the control gate being constructed to have connected thereto a voltage source for selectively modulating the electron emission from the electron source; and an anode, distally disposed with respect to the electron source, for collecting at least some of any emitted electrons, the anode and the electron source being constructed to have a second voltage source connected therebetween such that an electric field induced at the electron source provides for electron emission from the electron source toward the anode.

10. Electron emission apparatus comprising:

a plurality of electron sources, for emitting electrons, each including a supporting substrate having a major surface, a conductive/semiconductive path disposed on the major surface of the supporting substrate, and a plurality of preferentially crystallographically oriented diamond crystallites individually disposed on the conductive/semiconductive path;

an anode, distally disposed with respect to the plurality of electron sources, for collecting at least some of the emitted electrons; and the anode and the electron sources being constructed to have a second voltage source connected therebetween such that an electric field induced at each of the electron sources provides for electron emission from the electron source toward the anode.

11. The electron emission apparatus of claim 10 wherein the anode includes:

a substantially optically transparent faceplate;

a substantially optically transparent conductive layer disposed on the faceplate; and a cathodoluminescent layer deposited on the substantially optically transparent conductive layer.

12. Electron emission apparatus comprising:

a plurality of electron sources, for emitting electrons, each including a supporting substrate having a major surface; a conductive/semiconductive path disposed on the major surface of the supporting substrate; and a plurality of preferentially crystallographically oriented diamond crystallites individually disposed on the conductive/semiconductive path;

an insulator layer disposed on the major surface of the supporting substrate;

a plurality of control gates disposed on the insulator layer and each of which is further disposed substantially peripherally at least partially around an electron source of the plurality of electron sources;

switching means coupled to at least some of the plurality of control gates, the switching means being constructed to have connected thereto a first voltage source; and an anode, distally disposed with respect to the plurality of electron sources, for collecting at least some of the emitted electrons; and the anode and the electron sources being constructed to have a second voltage source connected therebetween such that an electric field induced at each of the electron sources provides for electron emission from the electron source toward the anode.

13. The electron emission apparatus of claim 12 wherein the anode includes:

a substantially optically transparent faceplate;

a substantially optically transparent conductive layer disposed on the faceplate; and a cathodoluminescent layer deposited on the substantially optically transparent conductive layer.

* * * * *